US010331027B2

(12) United States Patent
Sato et al.

(10) Patent No.: US 10,331,027 B2
(45) Date of Patent: Jun. 25, 2019

(54) IMPRINT APPARATUS, IMPRINT SYSTEM, AND METHOD OF MANUFACTURING ARTICLE

(71) Applicant: CANON KABUSHIKI KAISHA, Tokyo (JP)

(72) Inventors: Hiroshi Sato, Utsunomiya (JP); Hiroshi Morohoshi, Utsunomiya (JP); Yukio Takabayashi, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 476 days.

(21) Appl. No.: 14/835,147

(22) Filed: Aug. 25, 2015

(65) Prior Publication Data
US 2016/0075076 A1 Mar. 17, 2016

(30) Foreign Application Priority Data

Sep. 12, 2014 (JP) ................. 2014-187031
Aug. 18, 2015 (JP) ................. 2015-160957

(51) Int. Cl.
H01L 21/66 (2006.01)
G03F 7/00 (2006.01)

(52) U.S. Cl.
CPC ................. G03F 7/0002 (2013.01)

(58) Field of Classification Search
CPC .................................. G03F 7/0002
See application file for complete search history.

(56) References Cited

U.S. PATENT DOCUMENTS

| 8,976,370 B2 | 3/2015 | Miyakawa et al. |
| 2010/0096774 A1 | 4/2010 | Kruijt-Stegeman et al. |
| 2011/0290136 A1 | 12/2011 | Koga |
| 2012/0091611 A1 | 4/2012 | Yanagisawa |

(Continued)

FOREIGN PATENT DOCUMENTS

| CN | 1871103 A | 11/2006 |
| CN | 103135340 A | 6/2013 |

(Continued)

OTHER PUBLICATIONS

Office Action issued in Taiwanese Appln. No. 104127909 dated Aug. 22, 2016. English translation provided.

(Continued)

Primary Examiner — Galen H Hauth
(74) Attorney, Agent, or Firm — Rossi, Kimms & McDowell LLP

(57) ABSTRACT

The present invention provides an imprint apparatus which performs an imprint process for forming a pattern on an imprint material on a substrate using a mold, the apparatus including an obtaining unit configured to obtain each shape of a plurality of shot regions on the substrate before the mold and the shot region as an imprint target on the substrate face each other, a first correction unit configured to correct, for each shot region on the substrate, a shape difference between a pattern of the mold and the shot region, a measurement unit configured to measure a displacement between the pattern of the mold and the shot region on the substrate, a second correction unit configured to correct the displacement, and a control unit configured to control the imprint process.

17 Claims, 9 Drawing Sheets

(56) References Cited

U.S. PATENT DOCUMENTS

2013/0300031 A1    11/2013    Torii et al.
2014/0065735 A1*  3/2014    Koshiba .................. H01L 22/10
                                                                                   438/14

FOREIGN PATENT DOCUMENTS

| CN | 103135341 A | 6/2013 |
|---|---|---|
| JP | 2004327769 A | 11/2004 |
| JP | 2008504141 A | 2/2008 |
| JP | 2010098310 A | 4/2010 |
| JP | 2013098291 A | 5/2013 |
| KR | 1020060034694 A | 4/2006 |
| TW | 201421596 A | 6/2014 |
| WO | 2005121892 A2 | 12/2005 |
| WO | 2007084774 A2 | 7/2007 |

OTHER PUBLICATIONS

Notice of Preliminary Rejection issued in Korean Appln. No. 10-2015-0128890 dated Jul. 24, 2018.
Office Action issued in Japanese Application No. 2015-160957 dated Mar. 29, 2019.
Office Action issued in Chinese Application No. 201510570346.X dated Mar. 22, 2019. English translation provided.

* cited by examiner ed as a mass-production nanolithography technique for devices such as semiconductor devices and magnetic storage media. An imprint apparatus using an imprint technique cures a resin (imprint material) on a substrate while a mold on which a pattern is formed is in contact with the resin, and forms the pattern on the substrate by releasing the mold from the cured resin. In this case, as a resin curing method, a photo-curing method is generally used, which cures a resin by irradiation with light such as ultraviolet light.

IMPRINT APPARATUS, IMPRINT SYSTEM, AND METHOD OF MANUFACTURING ARTICLE

BACKGROUND OF THE INVENTION

Field of the Invention

The present invention relates to an imprint apparatus, an imprint system, and a method of manufacturing an article.

Description of the Related Art

An imprint technique is a technique of enabling the transfer of a nano-scale fine pattern and has been proposed by Japanese Patent Laid-Open No. 2010-98310 as a mass-production nanolithography technique for devices such as semiconductor devices and magnetic storage media. An imprint apparatus using an imprint technique cures a resin (imprint material) on a substrate while a mold on which a pattern is formed is in contact with the resin, and forms the pattern on the substrate by releasing the mold from the cured resin. In this case, as a resin curing method, a photo-curing method is generally used, which cures a resin by irradiation with light such as ultraviolet light.

When using an imprint apparatus, in order to maintain the performance of a device, it is necessary to accurately transfer a pattern on a mold onto a pattern (shot region) on a substrate. In this case, in general, the shape of the pattern on the mold is matched with the shape of the pattern on the substrate. For example, a correction mechanism which deforms the pattern on the mold by pushing and pulling its peripheral portion, that is, a correction mechanism which corrects the shape of a pattern is proposed in Japanese Patent Laid-Open No. 2008-504141.

In addition, the imprint apparatus generally uses die-by-die alignment as an alignment scheme between a mold and a substrate. Die-by-die alignment is an alignment scheme of correcting the displacement between a mold and a substrate by detecting marks provided on the mold and marks provided on the substrate for each shot region on the substrate.

A conventional imprint apparatus generally corrects the shape of a pattern on a mold by using the mark detection results obtained in die-by-die alignment. However, it is necessary to detect many marks to obtain the shape of a shot region on a substrate. It therefore requires much time for detection, leading to a reduction in the productivity of the imprint apparatus. In addition, the response speed of the correction mechanism for correcting the shape of a pattern is low, and hence there is a possibility that the shape of a mold cannot be completely corrected during die-by-die alignment.

In addition, there has been proposed a technique of obtaining the shape of a shot region of a substrate in advance. In this technique, the shape of a shot region within a substrate is represented by a fixed value (that is, the shape of each shot region is fixed to one shape). Alternatively, a shape at each shot position on each substrate is represented by a fixed value. This makes it impossible to cope with variations in shape among the respective shot regions within a substrate or among substrates, resulting in inability to sufficiently correct the shape of a pattern on a mold. Recently, with advances in microfabrication of devices, high overlay accuracy is required. As a result, such problems become especially conspicuous.

SUMMARY OF THE INVENTION

The present invention provides an imprint apparatus advantageous in terms of overlay accuracy between a mold and a substrate and productivity.

According to one aspect of the present invention, there is provided an imprint apparatus which performs an imprint process for forming a pattern on an imprint material on a substrate using a mold, the apparatus including an obtaining unit configured to obtain each shape of a plurality of shot regions on the substrate before the mold and the shot region as an imprint target on the substrate face each other, a first correction unit configured to correct, for each shot region on the substrate, a shape difference between a pattern of the mold and the shot region, a measurement unit configured to measure a displacement between the pattern of the mold and the shot region on the substrate, a second correction unit configured to correct the displacement, and a control unit configured to control the imprint process, wherein the imprint process includes a first process of causing the first correction unit to correct the shape difference based on the shape obtained in advance by the obtaining unit, and a second process of causing the second correction unit to correct the displacement while the displacement is measured by the measurement unit.

Further aspects of the present invention will become apparent from the following description of exemplary embodiments with reference to the attached drawings.

DESCRIPTION OF THE EMBODIMENTS

Figure 1:
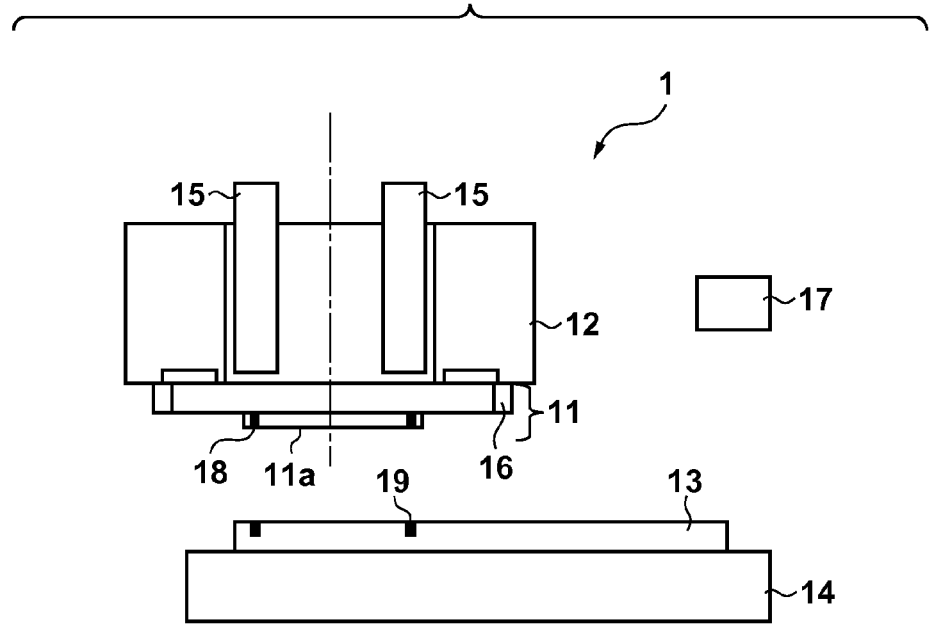
FIG. 1 is a schematic view showing the arrangement of an imprint apparatus according to one aspect of the present invention.

Preferred embodiments of the present invention will be described below with reference to the accompanying drawings. Note that the same reference numerals denote the same members throughout the drawings, and a repetitive description thereof will not be given.

<First Embodiment>

FIG. 1 is a schematic view showing the arrangement of an imprint apparatus 1 according to one aspect of the present invention. The imprint apparatus 1 forms a pattern on an imprint material on a substrate by using a mold. That is, this apparatus is a lithography apparatus which performs an imprint process of forming a pattern on a substrate by molding an imprint material on the substrate by using a mold. This embodiment uses, as a resin curing method, a photo-curing method of curing a resin by irradiating it with ultraviolet light.

The imprint apparatus 1 includes a mold holding unit 12 which holds a mold 11, a substrate holding unit 14 which holds a substrate 13, measurement units 15, a shape correction unit 16, and a control unit 17. In addition, the imprint apparatus 1 includes a resin supply unit including a dispenser for supplying a resin onto a substrate, a bridge surface plate for holding the mold holding unit 12, and a base surface plate for holding the substrate holding unit 14.

The mold 11 has a rectangular outer shape and includes a pattern surface 11a on which a pattern (convex-concave pattern) to be transferred onto the substrate 13 (a resin on it) is formed. The mold 11 is formed from a material which transmits ultraviolet light for curing a resin on a substrate, for example, quartz. Mold-side marks 18 are formed on the pattern surface 11a of the mold 11.

The mold holding unit 12 is a holding mechanism which holds the mold 11. The mold holding unit 12 includes a mold chuck which vacuum-chucks or electrostatically chucks the mold 11, a mold stage on which the mold chuck is mounted, and a driving system which drives (moves) the mold stage. This driving system drives the mold stage (that is, the mold 11) at least in the z-axis direction (the imprint direction in which the mold 11 is imprinted on a resin on a substrate). The driving system may have a function of driving the mold stage in the x-axis direction, the y-axis direction, and the θ (rotation about the z-axis) direction as well as the z-axis direction.

The substrate 13 is a substrate onto which a pattern on the mold 11 is transferred, and includes, for example, a single-crystal silicon substrate and an SOI (Silicon on Insulator) substrate. The resin supply unit supplies (applies) a resin to the substrate 13. Substrate-side marks 19 are respectively formed on a plurality of shot regions of the substrate 13.

The substrate holding unit 14 is a holding mechanism which holds the substrate 13. The substrate holding unit 14 includes, for example, a substrate chuck which vacuum-chucks or electrostatically chucks the substrate 13, a substrate stage on which the substrate chuck is mounted, and a driving system which drives (moves) the substrate stage. This driving system drives the substrate stage (that is, the substrate 13) at least in the x-axis direction and the y-axis direction (the directions perpendicular to the imprint direction of the mold 11). The driving system may have a function of driving the substrate stage in the z-axis direction and the θ (rotation about the z-axis) direction as well as the x-axis direction and the y-axis direction.

Each measurement unit 15 includes a scope which optically detects (observes) each mold-side mark 18 provided on the mold 11 and a corresponding one of the substrate-side marks 19 provided on each of a plurality of shot regions of the substrate 13. Each measurement unit 15 measures the relative positions (displacement) of the mold 11 and the substrate 13 based on the detection result obtained by this scope. Note however that each measurement unit 15 is required only to detect the relative positional relationship between each mold-side mark 18 and the corresponding substrate-side mark 19. Each measurement unit 15 may therefore include a scope including an optical system for simultaneously capturing images of two marks or a scope which detects a signal reflecting a relative positional relationship such as an interference signal or moire originating from two marks. In addition, each measurement unit 15 may not be capable of simultaneously detecting each mold-side mark 18 and the corresponding substrate-side mark 19. For example, each measurement unit 15 may obtain the positions of each mold-side mark 18, arranged inside and corresponding to a reference position, and the corresponding substrate-side mark 19 to detect the relative positional relationship between the mold-side mark 18 and the substrate-side mark 19.

Figure 2:
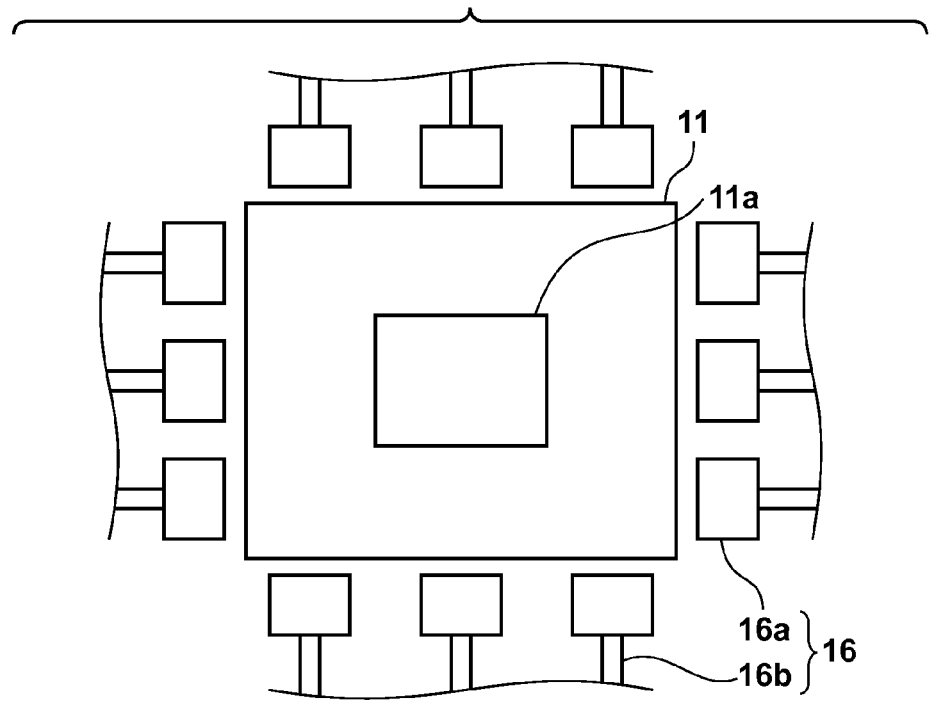
FIG. 2 is a view showing an example of the arrangement of the shape correction unit of the imprint apparatus shown in FIG. 1.

The shape correction unit 16 functions as the first correction unit which corrects the difference in shape between a pattern on the mold 11 and each shot region of the substrate 13. In this embodiment, the shape correction unit 16 corrects the shape of the pattern surface 11a by deforming the mold 11 (pattern surface 11a) by applying a force to the mold 11 in a direction parallel to the pattern surface 11a. For example, as shown in FIG. 2, the shape correction unit 16 includes chuck units 16a which chuck the side surfaces of the mold 11 and actuators 16b which drive the chuck units 16a in a direction to move toward the side surfaces of the mold 11 and a direction to move away from the side surfaces of the mold 11. Each chuck unit 16a may not have a function of chucking a side surface of the mold 11 and may be a contact member which comes into contact with a side surface of the mold 11. Note however that the shape correction unit 16 may deform the pattern surface 11a by applying heat to the mold 11 and controlling the temperature of the mold 11. In addition, in some case, the shape of a shot region of the substrate 13 (the pattern formed on the substrate 13) may be corrected by locally thermally expanding the substrate 13 by irradiating the substrate at a predetermined position with light having constant intensity instead of deforming the pattern surface 11a of the mold 11. In this case, the imprint apparatus 1 includes a heat supply unit serving as a shape correction unit which supplies heat to the mold 11 or the substrate 13.

The control unit 17 includes a CPU and a memory and controls the overall imprint apparatus 1 (the respective units of the imprint apparatus 1). In this embodiment, the control unit 17 controls the imprint process and related processes. For example, the control unit 17 performs alignment between the mold 11 and the substrate 13 based on the measurement result obtained by the measurement unit 15 when performing the imprint process. In addition, when performing the imprint process, the control unit 17 controls the amount of deformation of the pattern surface 11a of the mold 11 by the shape correction unit 16.

Each mold-side mark 18 and the corresponding substrate-side mark 19 serving as alignment marks used for alignment between the mold 11 and the substrate 13 will be described with reference to FIGS. 3A and 3B. Assume that in this embodiment, six chip regions are arranged in one shot region of the substrate 13.

Figure 3A:
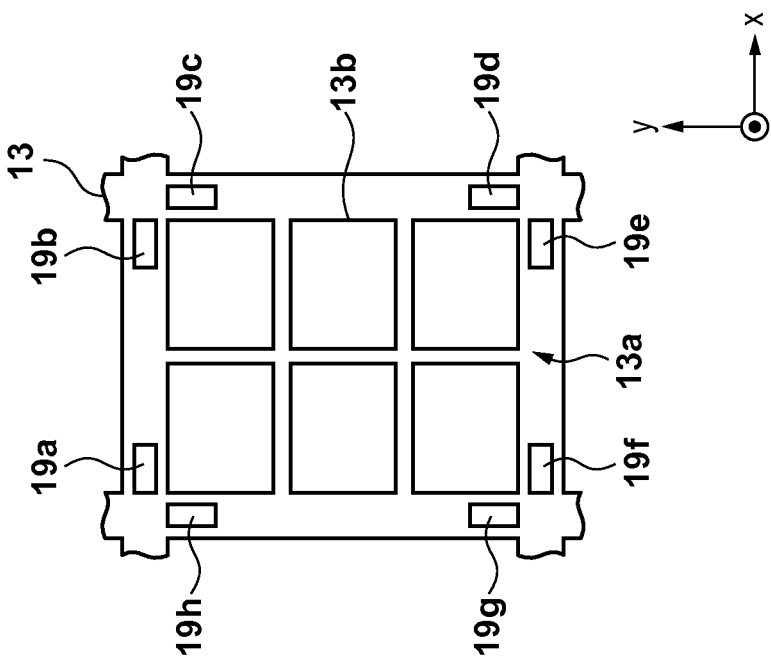
FIGS. 3A and 3B are views showing an example of mold-side marks provided on a mold and substrate-side marks provided on a substrate.

FIG. 3A shows mold-side marks 18a to 18h provided on the pattern surface 11a of the mold 11, more specifically, the four corners of the pattern surface 11a. Referring to FIG. 3A, the mold-side marks 18a, 18b, 18e, and 18f, each having a longitudinal direction in the horizontal direction, are marks each having a measurement direction in the x-axis direction. In contrast, the mold-side marks 18c, 18d, 18g, and 18h, each having a longitudinal direction in the vertical direction, are marks each having a measurement direction in the y-axis direction. In addition, referring to FIG. 3A, the regions enclosed by the dotted lines indicate pattern regions 11b in which patterns to be respectively transferred onto the six chip regions of the substrate described above are formed.

Figure 3B:
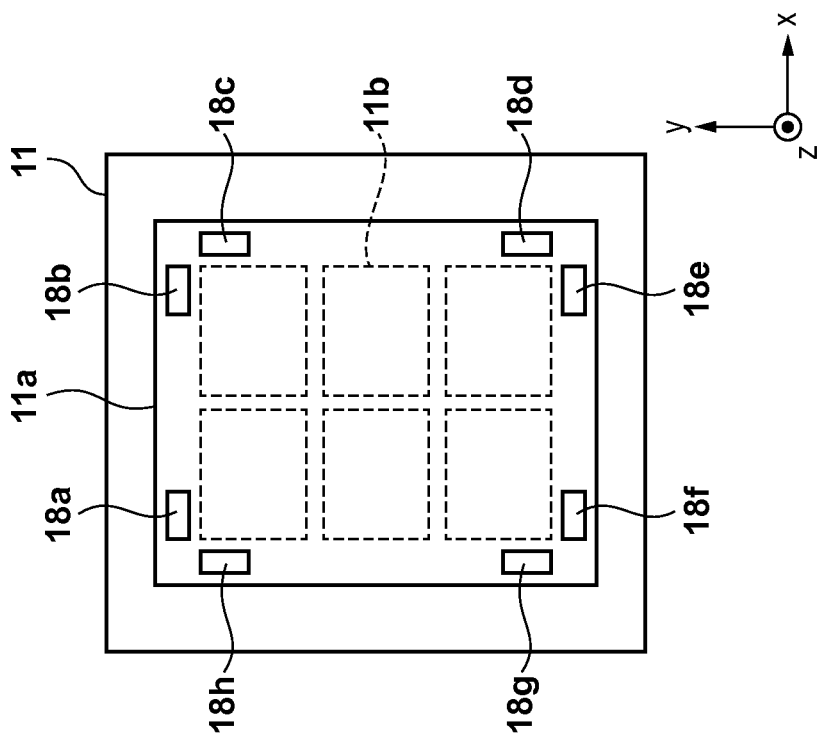

FIG. 3B shows substrate-side marks 19a to 19h provided on the periphery of one shot region 13a of the substrate 13, more specifically, the four corners of the shot region 13a. Referring to FIG. 3B, the substrate-side marks 19a, 19b, 19e, and 19f, each having a longitudinal direction in the horizontal direction, are marks each having a measurement direction in the x-axis direction. In contrast, the substrate-side marks 19c, 19d, 19g, and 19h, each having a longitudinal direction in the vertical direction, are marks each having a measurement direction in the y-axis direction. In addition, referring to FIG. 3B, the regions enclosed by the solid lines inside the shot region 13a are chip regions 13b.

When the imprint process is to be performed, that is, the mold 11 is made to respectively come into contact with the resin of the substrate, the mold-side marks 18a to 18h provided on the mold 11 are made to come close to the substrate-side marks 19a to 19h provided on the substrate 13. It is therefore possible to compare the position and shape of the pattern surface 11a of the mold 11 with those of the shot region 13a of the substrate 13 by detecting the mold-side marks 18 and the substrate-side marks 19 using the measurement units 15. If differences (deviations) occur between the position and shape of the pattern surface 11a of the mold 11 and those of the shot region 13a of the substrate 13, the overlay accuracy deteriorates, resulting in transfer failure (product failure) in the pattern.

FIGS. 4A to 4H are views showing the deviations between the position and shape of the pattern surface 11a of the mold 11 and those of the shot region 13a of the substrate 13 (to be referred to as "the deviations between the mold 11 and the shot region 13a" hereinafter). The deviations between the mold 11 and the shot region 13a include a shift, a magnification deviation, and a rotation. Detecting the displacement (displacement amount) of the mold-side mark 18 relative to the substrate-side mark 19 makes it possible to estimate that the deviation between the mold 11 and the shot region 13a is a shift, a magnification deviation, or a rotation.

Figure 4C:
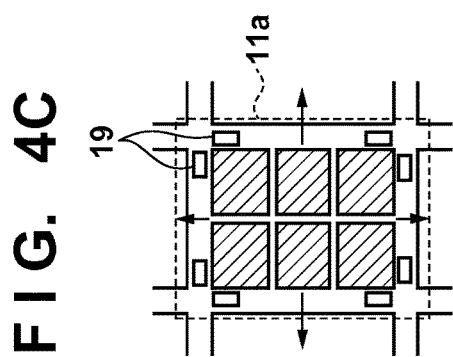
FIGS. 4A to 4E are views showing the deviations between the pattern surface of a mold and a shot region of a substrate.
Figure 4B:
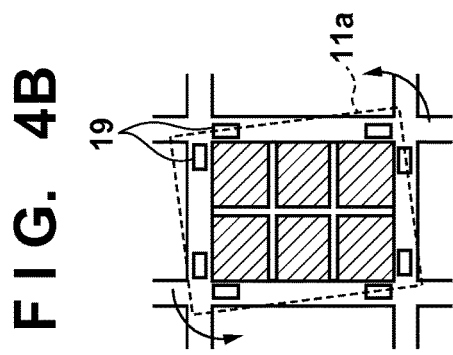
Figure 4E:
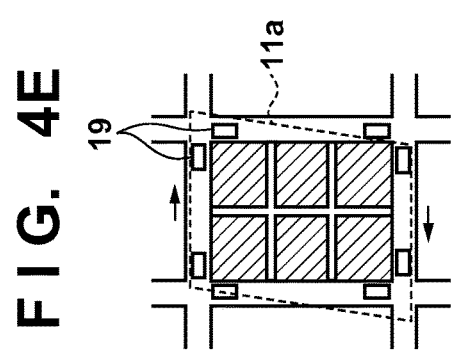
Figure 4A:
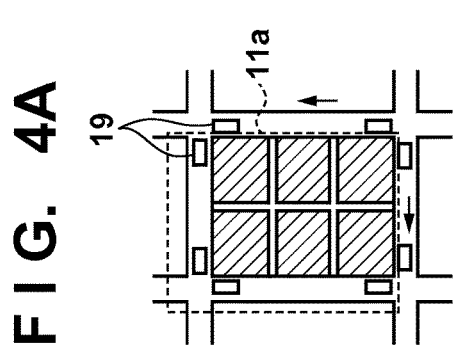

FIG. 4A shows a case in which the deviation between the mold 11 and the shot region 13a is a shift. Detecting that each mold-side mark 18 deviates from the corresponding substrate-side mark 19 in one direction can estimate that the deviation between the mold 11 and the shot region 13a is a shift.

FIG. 4B shows a case in which the deviation between the mold 11 and the shot region 13a is a rotation. If the deviation direction of each mold-side mark 18 differs between the upper, lower, left, and right sides of the shot region 13a so as to draw a circle centered on a given point in the shot region, it can be estimated that the deviation between the mold 11 and the shot region 13a is a rotation.

FIG. 4C shows a case in which the deviation between the mold 11 and the shot region 13a is a magnification deviation. If it is detected that each mold-side mark 18 uniformly deviates inward or outward with respect to the center of the shot region 13a, it can be estimated that the deviation between the mold 11 and the shot region 13a is a magnification deviation.

Figure 4D:
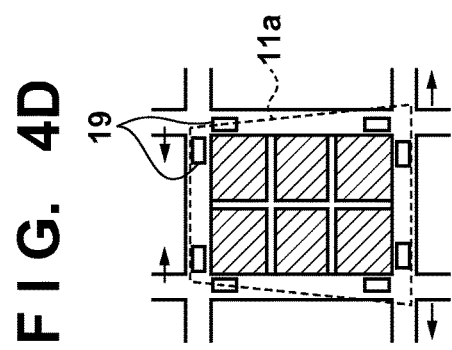

FIG. 4D shows a case in which the deviation between the mold 11 and the shot region 13a is a trapezoidal deviation. If it is detected that each mold-side mark 18 deviates inward or outward with respect to the center of the shot region 13a and the direction differs between the upper and lower sides or the left and right side of the shot region 13a, it can be estimated that the deviation between the mold 11 and the shot region 13a is a trapezoidal deviation. In addition, if it is detected that each mold-side mark 18 deviates inward or outward with respect to the center of the shot region 13a and the deviation amount differs between the upper and lower sides or the left and right side of the shot region 13a, it can be estimated that the deviation between the mold 11 and the shot region 13a is a trapezoidal deviation.

FIG. 4E shows a case in which the deviation between the mold 11 and the shot region 13a is a twist. If it is detected that the deviation direction for each mold-side mark 18 differs between the upper and lower sides or the left and right sides of the shot region 13a, it can be estimated that the deviation between the mold 11 and the shot region 13a is a twist.

As shown in FIGS. 4C to 4E, if the deviation between the mold 11 and the shot region 13a is a magnification deviation, trapezoidal deviation, twist, or the like, the control unit 17 causes the shape correction unit 16 to deform the shape of the pattern surface 11a of the mold 11. Although not shown, even if the deviation between the mold 11 and the shot region 13a is an arched deviation, barrel deviation, pincushion deviation, or the like, the control unit 17 causes the shape correction unit 16 to deform the shape of the pattern surface 11a of the mold 11. More specifically, the control unit 17 controls the amount of deformation of the pattern surface 11a by the shape correction unit 16 so as to match the shape of the pattern surface 11a of the mold 11 with the shape of the shot region 13a of the substrate 13. Depending on the type of deviation between the mold 11 and the shot region 13a, it is necessary to detect other alignment marks in addition to the alignment marks shown in FIGS. 3A and 3B. Since the number of measurement units 15 which can be arranged in the imprint apparatus 1 is limited, the measurement units 15 can move to detect many alignment marks. The control unit 17 obtains in advance data representing the correspondence relationship between the driving amount of each actuator 16b (that is, the force applied to the mold 11) and the deformation amount of the pattern surface 11a and stores the data in a memory or the like. The control unit 17 calculates the deformation amount (the degree of deformation of the pattern surface 11a) which is required to match the shape of the pattern surface 11a with the shape of the shot region 13a based on the measurement result obtained by each measurement unit 15. The control unit 17 then obtains the driving amount of each actuator 16b which corresponds to the calculated deformation amount of the pattern surface 11a from the data stored in the memory, and drives the actuator 16b.

In this manner, the imprint apparatus 1 transfers a pattern on the mold 11 onto a resin on a substrate while correcting the alignment between the mold 11 and the substrate 13 (shot region 13a) and the shape of the mold 11 (pattern surface 11a).

Figure 5:
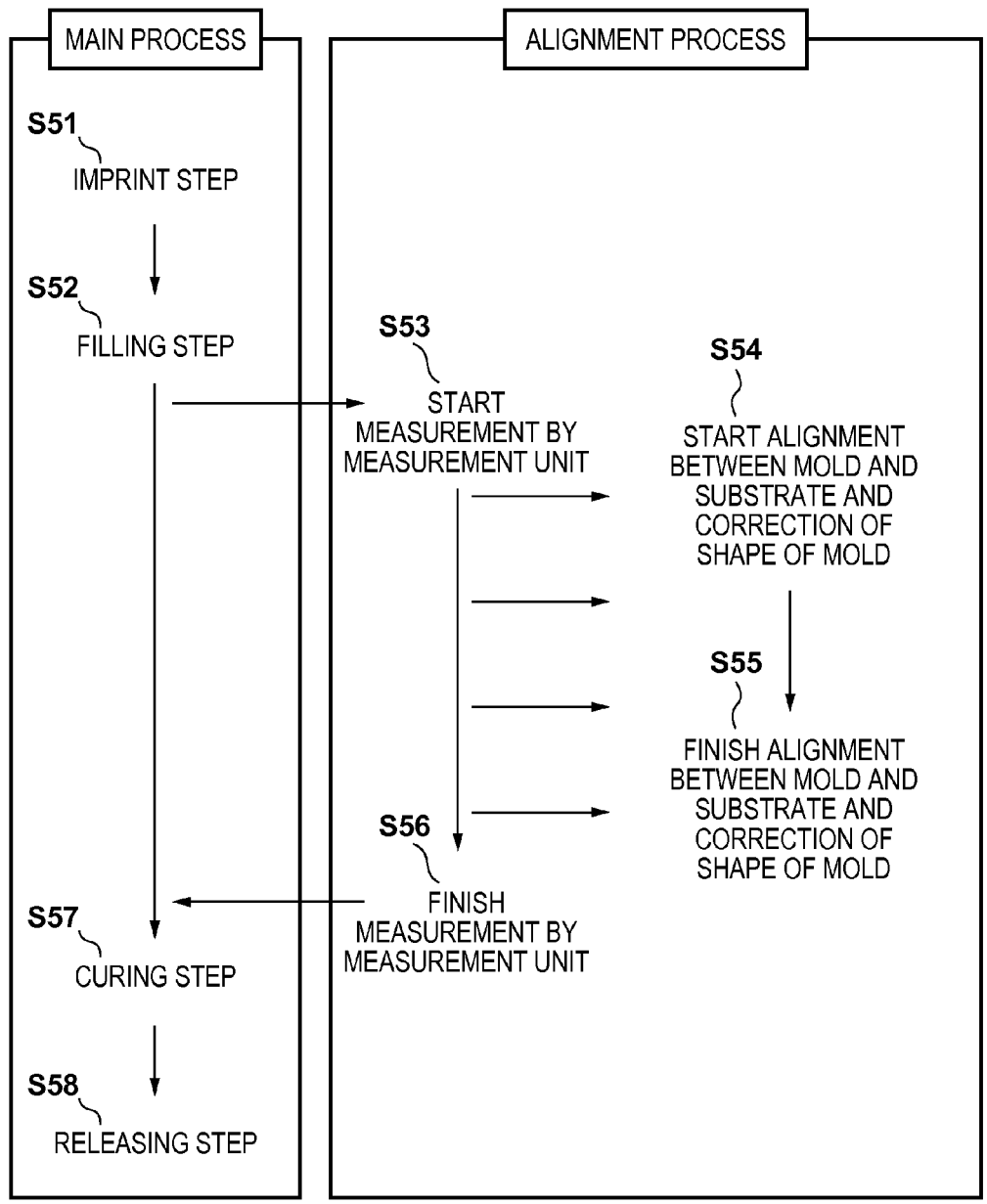
FIG. 5 is a view showing a sequence for a general imprint process.

FIG. 5 is a view showing a sequence for a general imprint process including alignment between the mold 11 and the substrate 13 and the correction of the shape of the mold 11. FIG. 5 separately shows, in the imprint process, the main process mainly associated with the operation of the mold 11 for the formation of a pattern on a substrate and the alignment process associated with alignment between the mold 11 and the substrate 13 and the correction of the shape of the mold 11. Note that in an imprint step, since the mold 11 is required to come into contact with the resin of the substrate, the substrate holding unit 14 holding the substrate 13 may be vertically driven.

In step S51, an imprint step is performed, in which the mold 11 is made to face the shot region 13a as an imprint target on the substrate 13, and the mold 11 is brought into contact with the resin of the substrate. In step S52, a filling step is started, in which the pattern on the mold 11 is filled with the resin while the contact state between the mold 11 and the resin on the substrate is maintained. In the filling step, the resin interposed between the mold 11 and the substrate 13 is spread by being sandwiched between them and simultaneously fills the pattern on the mold 11.

When the filling step starts, the measurement unit 15 starts, in step S53, to measure the displacement between the pattern surface 11a of the mold 11 and the shot region 13a and the difference in shape between the pattern surface 11a of the mold 11 and the shot region 13a. When simultaneously measuring alignment marks on the mold 11 and the substrate 13, since the distance between the marks needs to be sufficiently small, measurement starts after the start of the filling step. Note that measurement by the measurement unit 15 may be started before the start of the filling step as long as the measurement unit 15 can detect alignment marks on the mold 11 and the substrate 13. In step S53, since it is necessary to measure the difference in shape between the pattern surface 11a of the mold 11 and the shot region 13a, the measurement unit 15 needs to detect many mold-side marks 18 and substrate-side marks 19.

In step S54, alignment between the mold 11 and the substrate 13 and the correction of the shape of the mold 11 are started based on the measurement results obtained by the measurement units 15. More specifically, while the measurement units 15 measure the displacement between the pattern surface 11a of the mold 11 and the shot region 13a of the substrate 13, the displacement between the pattern surface 11a and the shot region 13a is corrected by driving the mold stage and the substrate sage. In addition, while the measurement units 15 measure the difference in shape between the pattern surface 11a of the mold 11 and the shot region 13a of the substrate 13, the shape correction unit 16 corrects the difference in shape between the pattern surface 11a and the shot region 13a by deforming the pattern surface 11a.

The measurement unit 15 sequentially measures the difference in shape between the pattern surface 11a and the shot region 13a and the displacement between the pattern surface 11a and the shot region 13a. The measurement results are sequentially reflected in alignment between the mold 11 and the substrate 13 and the correction of the shape of the mold 11.

If the displacement between the pattern surface 11a and the shot region 13a and the difference in shape between the pattern surface 11a and the shot region 13a fall within an allowable range, alignment between the mold 11 and the substrate 13 and the correction of the shape of the mold 11 are finished in step S55. In addition, in step S56, the measurement unit 15 finishes measuring the displacement between the pattern surface 11a and the shot region 13a and the difference in shape between the pattern surface 11a and the shot region 13a.

In step S57, a curing step is performed, in which while the mold 11 is in contact with the resin on the substrate, the resin supplied to the shot region 13a as an imprint target is cured by being irradiated with ultraviolet light through the mold 11.

In step S58, a releasing step is performed, in which the mold stage is driven to release the mold 11 from the cured resin on the shot region 13a of the substrate 13. With this process, the pattern on the mold 11 is transferred onto the resin on the shot region 13a of the substrate 13, and the pattern on the resin is formed on the shot region 13a.

According to the sequence for the imprint process shown in FIG. 5, the filling step (step S52) generally requires the most time, and hence determines productivity. If, however, high accuracy is required for overlaying between the mold 11 and the substrate 13, alignment between the mold 11 and the substrate 13 and the correction of the shape of the mold 11 (step S54) require much time. In particular, since the response speed of the shape correction unit 16 is low, the correction of the shape of the mold 11 takes much time. On the other hand, the imprint apparatus is required to further improve productivity. Under the circumstances, this embodiment provides an imprint process which suppresses a deterioration in productivity even if the correction of the shape of the mold 11 takes much time.

Of the deviations between the mold 11 and the shot region 13a, the shift shown in FIG. 4A and the rotation shown in FIG. 4B can be corrected by relatively driving and rotating the mold 11 and the substrate 13. For example, since the response speed of the substrate stage is high, it does not take much time to correct a shift and a rotation. In addition, it is not until the mold 11 is made to face the shot region 13a as an imprint target on the substrate 13 that a shift and a rotation can be detected in the imprint process, it is difficult to measure them in advance.

Of the deviations between the mold 11 and the shot region 13a, the magnification deviation shown in FIG. 4C, the trapezoidal deviation shown in FIG. 4D, and the twist shown in FIG. 4E are determined before the mold 11 is made to face the shot region 13a as an imprint target of the substrate 13. It is therefore possible to measure a magnification deviation and a trapezoidal deviation in advance. As described above, since the response speed of the shape correction unit 16 is low, it takes much time to correct the shape of the mold 11. For this reason, a magnification deviation, a trapezoidal deviation, a twist, and the like associated with the correction of the shape of the mold 11 are measured (obtained) in advance, and the shape of the mold 11 is corrected by using the pre-measurement results. In addition, alignment between the mold 11 and the substrate 13 is performed concurrently with the correction of the shape of the mold 11.

Note that a scheme of deforming the mold 11 is mainly explained as a scheme for correcting the difference in shape between the pattern surface 11a and the shot region 13a in this embodiment. However, as mentioned above, a scheme for correcting the difference in shape between the pattern surface 11a and the shot region 13a by deforming the substrate 13 is also proposed. Although a response speed of this scheme is comparatively high, it is necessary to measure sufficient number of alignment marks in order to measure the difference in shape between the pattern surface 11a and the shot region 13a with accuracy (improve the shape correction).

In the imprint process, the measurement units for measuring large number of alignment marks are needed in order to measure the difference in shape between the pattern surface 11a and the shot region 13a with accuracy in the state where the mold 11 is made to face the substrate 12. In addition, when considering the sequence of the imprint process from which the productivity is required (performing the imprint step, filling step, curing step and releasing step at short times), it is difficult to measure the large number of alignment marks within the sequence of the imprint process.

Therefore, the response of the shape correction is also related, but the difference in shape between the pattern surface 11a and the shot region 13a may be measured with efficient accuracy in order to improve the shape correction regardless of the scheme of the shape correction.

Figure 6:
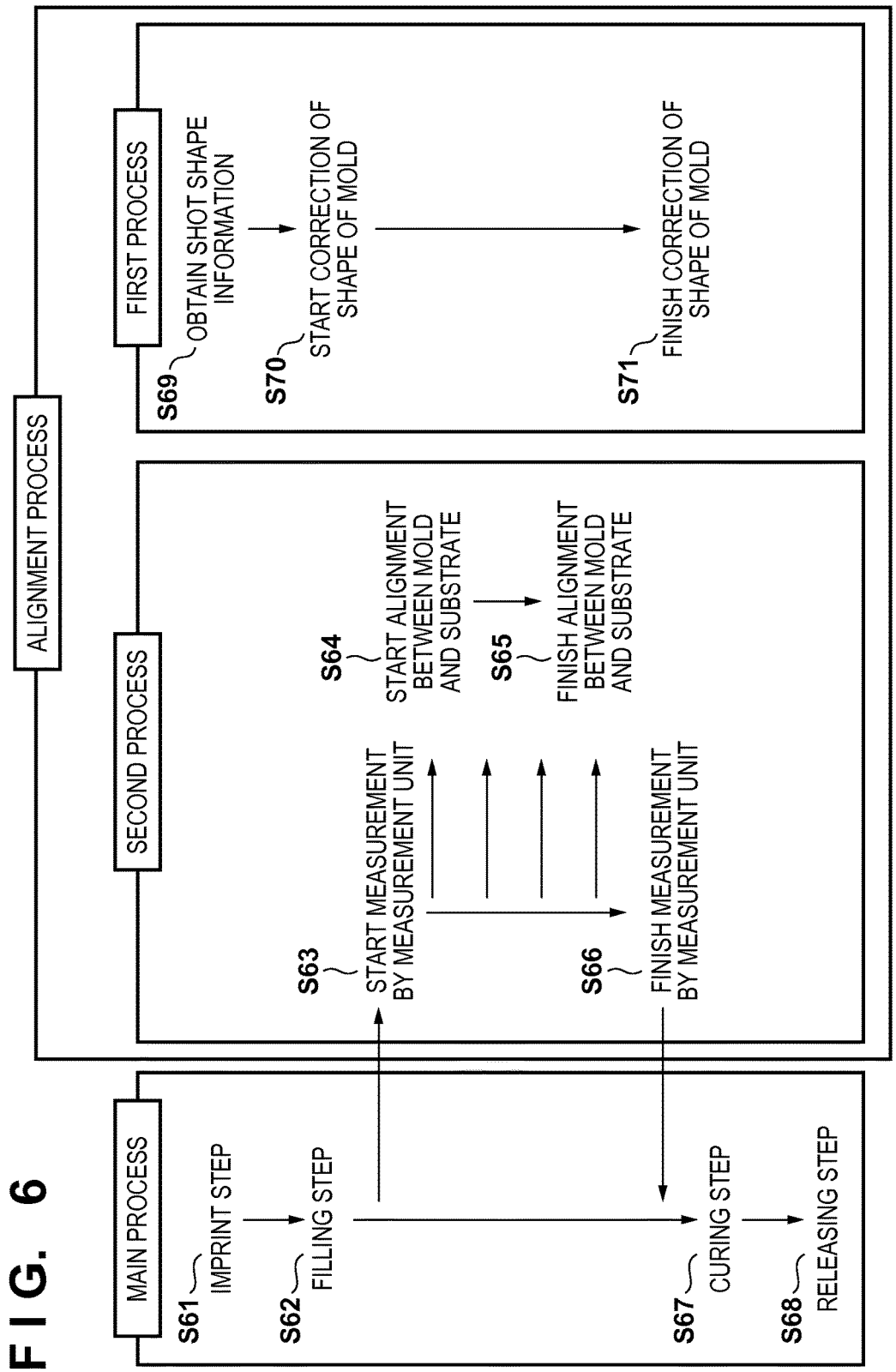
FIG. 6 is a view showing a sequence for an imprint process according to this embodiment.

FIG. 6 is a view showing a sequence for an imprint process according to this embodiment. FIG. 6 separately shows, in the imprint process, the main process associated with the operation for the formation of a pattern on a substrate and the alignment process associated with alignment between the mold 11 and the substrate 13 and the correction of the shape of the mold 11. In addition, in the embodiment, the alignment process is divided into the first process of correcting the difference in shape between a pattern on the mold 11 and the shot region 13a of the substrate 13 and the second process of correcting the displacement between the pattern on the mold 11 and the shot region 13a of the substrate 13. Note that since the imprint step in step S61, the filling step in step S62, the curing step in step S67, and the releasing step in step S68 shown in FIG. 6 are the same as those in steps S51, S52, S57, and S58 in FIG. 5, a detailed description of them will be omitted.

The second process of correcting the displacement between the pattern on the mold 11 and the shot region 13a of the substrate 13 will be described first. When the filling step starts, the measurement unit 15 starts to measure the displacement between the pattern surface 11a of the mold 11 and the shot region 13a in step S63. In step S63, it is not necessary to measure the difference in shape between the pattern surface 11a of the mold 11 and the shot region 13a, and it is necessary to measure only the displacement between the pattern surface 11a and the shot region 13a. Therefore, the measurement unit 15 may detect the mold-side marks 18 and the substrate-side marks 19 of numbers smaller than those in step S53. This allows the measurement unit 15 to perform measurement in step S63 in a time shorter than when performing measurement in step S53. In this embodiment, the measurement unit 15 mainly measures the shift shown in FIG. 4A and the rotation shown in FIG. 4B between the pattern surface 11a of the mold 11 and the shot region 13a.

In step S64, alignment between the mold 11 and the substrate 13 starts based on the measurement result obtained by each measurement unit 15. More specifically, while the measurement units 15 measure the displacement between the pattern surface 11a of the mold 11 and the shot region 13a of the substrate 13, the mold stage and the substrate state are driven to correct the displacement between the pattern surface 11a and the shot region 13a. In this manner, the mold holding unit 12 including the mold stage and the substrate holding unit 14 including the substrate stage function as the second correction unit which corrects the displacement between the pattern surface 11a of the mold 11 and the shot region 13a of the substrate 13. The measurement unit 15 sequentially measures the displacements between the pattern surface 11a of the mold 11 and the shot region 13a. The measurement results are sequentially reflected in alignment between the mold 11 and the substrate 13.

When the displacement between the pattern surface 11a and the shot region 13a falls within an allowable range, the alignment between the mold 11 and the substrate 13 is finished in step S65. In addition, in step S66, the measurement unit 15 finishes measuring the displacement between the pattern surface 11a of the mold 11 and the shot region 13a.

The first process of correcting the difference in shape between the mold 11 and the shot region 13a of the substrate 13 will be described next. As described above, it is possible to measure in advance the shape of the pattern surface 11a of the mold 11 and the shape of the shot region 13a of the substrate 13 without requiring to keep the mold 11 facing the shot region 13a of the substrate 13. For this reason, this embodiment provides an imprint system which measures the shape of the shot region 13a of the substrate 13 in advance by using a measurement device outside the imprint apparatus 1 before the substrate 13 is loaded into the imprint apparatus 1.

Figure 7:
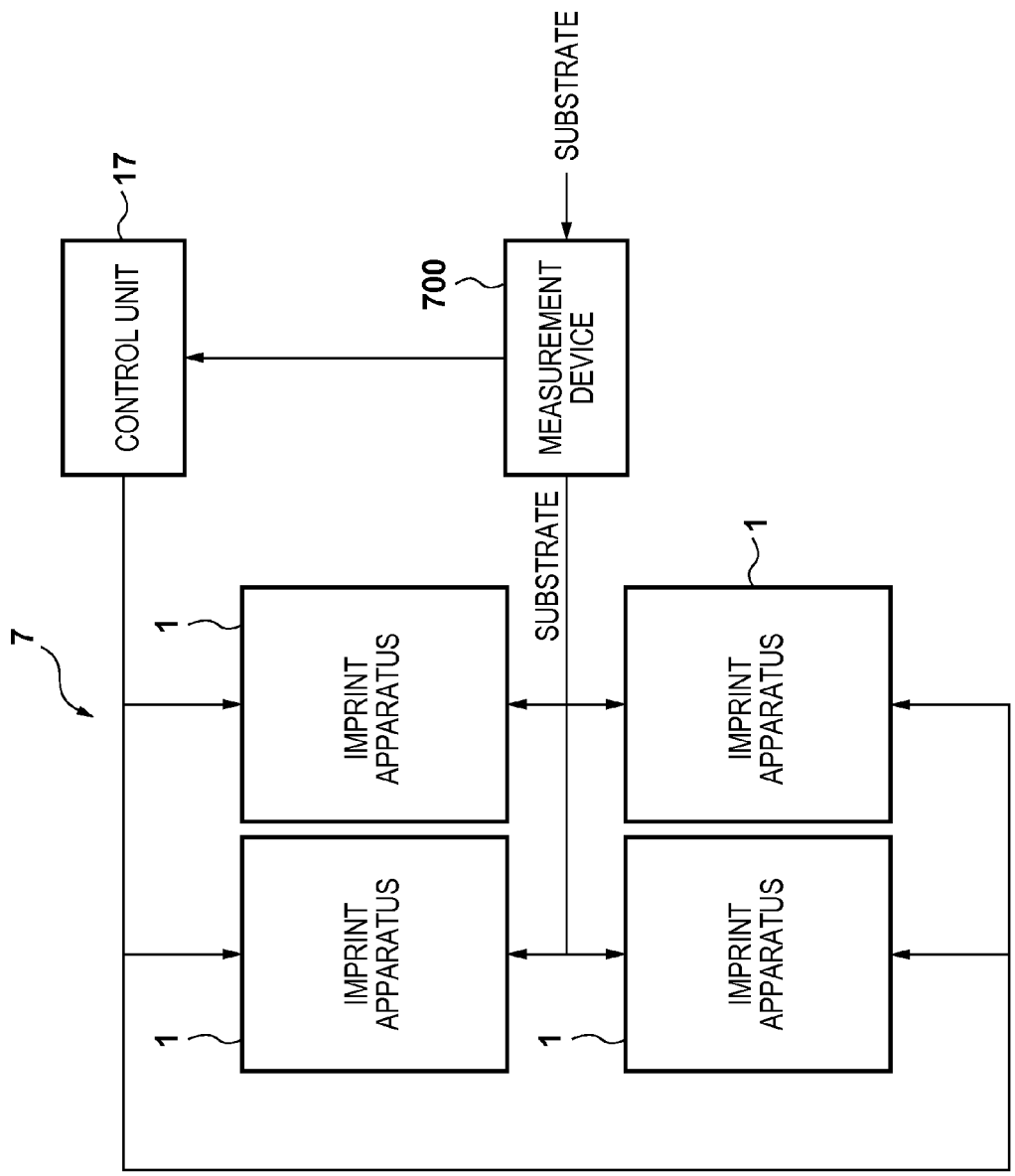
FIG. 7 is a schematic view showing the arrangement of an imprint system according to one aspect of the present invention.

FIG. 7 is a schematic view showing the arrangement of an imprint system 7 according to one aspect of the present invention. The imprint system 7 includes a plurality of imprint apparatuses 1 each configured to perform the imprint process of forming a pattern on a resin on a substrate by using the mold 11, and a measurement device 700. According to the related art, the substrate 13 is directly loaded into the imprint apparatus 1. In contrast to this, according to this embodiment, before the substrate 13 is loaded into the imprint apparatus 1, the substrate 13 is loaded into the measurement device 700. The measurement device 700 measures the shape of each of a plurality of shot regions 13a of the substrate 13, and sends the measurement results as shot shape information to the control unit 17. In addition, the substrates 13 having the shot regions 13a whose shapes are measured by the measurement device 700 are sequentially loaded into the imprint apparatuses 1. Note that FIG. 7 shows one of the control units 17 of the plurality of imprint apparatuses 1 as a main control unit which controls each corresponding one of the plurality of imprint apparatuses 1. Note however that this system may be provided with a main control unit which controls each of the plurality of imprint apparatuses 1 in addition to the control units 17 of the respective imprint apparatuses 1.

Figure 8A:
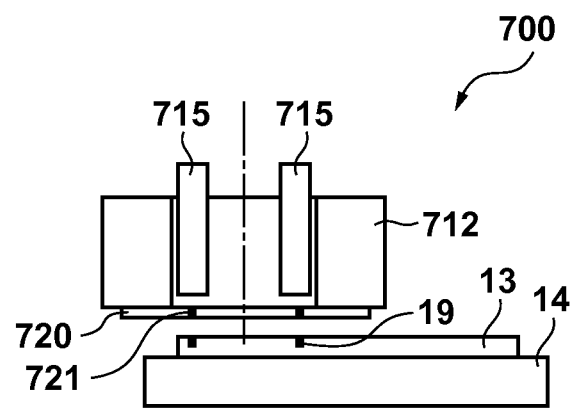
FIGS. 8A and 8B are schematic views each showing an example of the arrangement of a measurement device in the imprint system shown in FIG. 7.
Figure 8B:
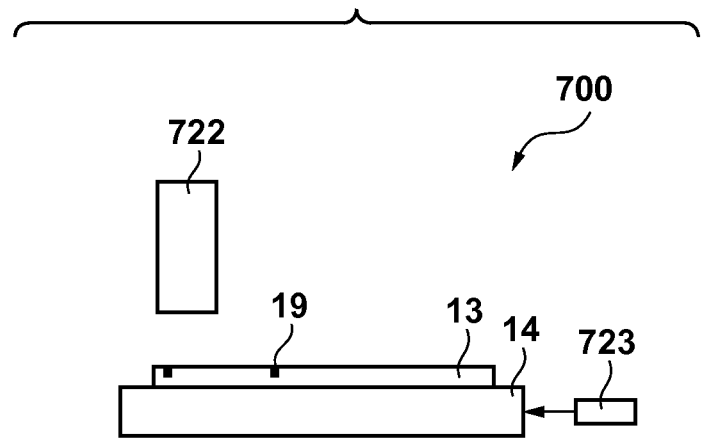

FIGS. 8A and 8B are schematic views showing an example of the arrangement of the measurement device 700 in the imprint system 7. The measurement device 700 shown in FIG. 8A uses the same measurement method as that used by the measurement unit 15 in the imprint apparatus 1, that is, die-by-die alignment measurement. The measurement device 700 shown in FIG. 8A includes a measurement instrument 715, a reference plate 720, and a holding unit 712 which holds the reference plate 720. The reference plate 720 is a plate member as a reference for the shape of the shot region 13a of the substrate 13, and has a reference plate-side mark 721 at a position corresponding to the substrate-side mark 19 provided on the substrate 13. The measurement instrument 715 optically detects (observes) each reference plate-side mark 721 and the corresponding substrate-side mark 19, and measures the shape of each shot region 13a of the substrate 13 like that shown in FIGS. 4A to 4E. In this embodiment, the measurement instrument 715 detects the substrate-side marks 19 provided on the four corners of the shot region 13a of the substrate 13. However, it is possible to increase the number of substrate-side marks 19 as detection targets in accordance with the components of the shape of the shot region 13a as a measurement target. For example, if the shot region 13a of the substrate 13 has a arched shape, barrel shape, or pincushion shape, it is necessary to detect not only the substrate-side marks 19 provided on the four corners of the shot region 13a of the substrate 13 but also other substrate-side marks 19.

The measurement device 700 shown in FIG. 8B includes a measurement instrument 722 and an interferometer 723. The measurement instrument 722 has measurement accuracy higher than that of the measurement unit 15 in the imprint apparatus 1. The measurement instrument 722 includes an image sensor and sequentially detects the substrate-side marks 19 provided on the substrate 13 by absolute position measurement with reference to the image sensor. In the imprint apparatus 1, the measurement unit 15 needs to be compact because of spatial restriction and the like. On the other hand, the measurement device 700 allows the formation of the measurement instrument 722 having high measurement accuracy because of relatively moderate spatial restriction. The measurement device 700 shown in FIG. 8B does not require the reference plate 720 to be relatively compared with the substrate-side mark 19, unlike the measurement device 700 shown in FIG. 8A. However, the positional accuracy of the substrate holding unit 14 (substrate stage) influences the measurement accuracy of the measurement instrument 722. For this reason, the measurement device 700 shown in FIG. 8B is provided with the interferometer 723 which accurately measures the position of the substrate holding unit 14. The measurement device 700 shown in FIG. 8B can measure various components of the shape of the shot region 13a by sequentially detecting the necessary number of substrate-side marks 19 within a time limit. In addition, the measurement device 700 may be provided with a plurality of measurement instruments 722 to shorten the time required to measure the shape of the shot region 13a. Alternatively, the detection field of the measurement instrument 722 may be broadened to simultaneously detect a plurality of substrate-side marks 19.

Referring back to FIG. 6, in step S69, the control unit 17 obtains shot shape information from the measurement device 700. In this manner, the control unit 17 functions as an obtaining unit which obtains shot shape information, that is, the shape of each of a plurality of shot regions 13a of the substrate 13.

In step S70, correction of the shape of the mold 11 is started to be performed based on the shot shape information obtained in advance by the control unit 17. More specifically, the control unit 17 causes the shape correction unit 16 to correct the difference in shape between the pattern surface 11a of the mold 11 and the shot region 13a as an imprint target of the substrate 13 based on the shape of each shot region 13a of the substrate 13 obtained in advance by the control unit 17. In this case, the difference in shape between the pattern surface 11a of the mold 11 and the shot region 13a as an imprint target of the substrate 13 includes at least one of the magnification deviation shown in FIG. 4C, the trapezoidal deviation shown in FIG. 4D, and the twist shown in FIG. 4E.

This embodiment can correct the shape of the mold 11 based on the shot shape information obtained in advance, and hence it is possible to start to correct the shape of the mold 11 after the releasing step with respect to the previous shot region. It is therefore possible to ensure a sufficient time for the correction of the shape of the mold 11.

In addition, measuring (obtaining) variations in rotation for each array or shot region within a plane of the substrate 13 can reduce the displacement between the pattern surface 11a of the mold 11 and the shot region 13a at the start of measurement by the measurement unit 15 in step S63. When the mold 11 or the substrate 13 is moved while the mold 11 is in contact with the resin on the substrate, a shearing force acts to cause distortion of the mold 11. It is therefore preferable to minimize the movement amount of the mold 11 or the substrate 13 when performing alignment between the mold 11 and the substrate 13.

In addition, the frequency of measuring the shape of the shot region 13a of the substrate 13 is determined in accordance with required overlay accuracy. For example, if the differences in shape among the shot regions 13a of the substrates in a lot are sufficiently small, the shapes of the shot regions of only the first substrate in the lot may be measured. In contrast, if the differences in shape among the shot regions 13a among the substrates in a lot cannot be neglected, it is necessary to measure the shapes of the shot regions of all the substrate in the lot.

In addition, the number of shot regions 13a whose shapes are to be measured may be adjusted within a substrate in consideration of productivity. If it is possible to ensure a sufficient time for measurement, the shapes of all the shot regions 13a of the substrate 13 may be measured. This makes it possible to obtain the actual shapes of all the shot regions 13a of the substrate 13. In contrast, if it is not possible to ensure a sufficient time for measurement, the shapes of some shot regions (for example, the shapes of every several shot regions) of all the shot regions 13a of the substrate 13 may be measured. In this case, the shapes of the remaining shot regions of all the shot regions 13a of the substrate 13 can be obtained from the measured shapes of the some shot regions. If, for example, the shapes of the respective shot regions 13a of the substrate 13 linearly change with respect to the positions of the respective shot regions 13a, the shapes of the remaining shot regions may be obtained by performing least-square approximation of the measured shapes of the some shot regions. If the shapes of the respective shot regions 13a of the substrate 13 do not linearly change with respect to the positions of the respective shot regions 13a, the shapes of the remaining shot regions may be obtained by weighted averaging of the measured shapes of the some shot regions.

Figure 9A:
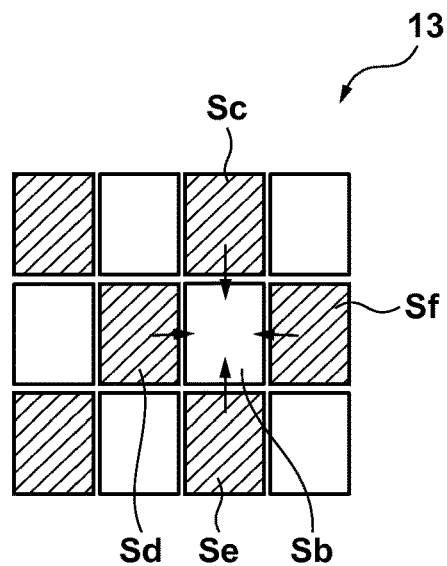
FIGS. 9A and 9B are views each showing an example of the layout of shot regions of a substrate.

FIG. 9A is a view showing an example of the layout of the shot region 13a of the substrate 13. Referring to FIG. 9A, the shot regions indicated by the oblique lines represent shot regions whose shapes are measured, and the shot regions in white represent shot regions whose shapes are not measured. In general, the shapes of the respective shot regions 13a of the substrate 13 continuously change. Therefore, the shape of a shot region Sb whose shape is not measured can be considered to continuously change from the shapes of shot regions Sc, Sd, Se, and Sf around the shot region Sb. It is therefore possible to obtain (predict) the shape of the shot region Sb, whose shape is not measured, by averaging the measured shapes of the shot regions Sc, Sd, Se, and Sf.

Figure 9B:
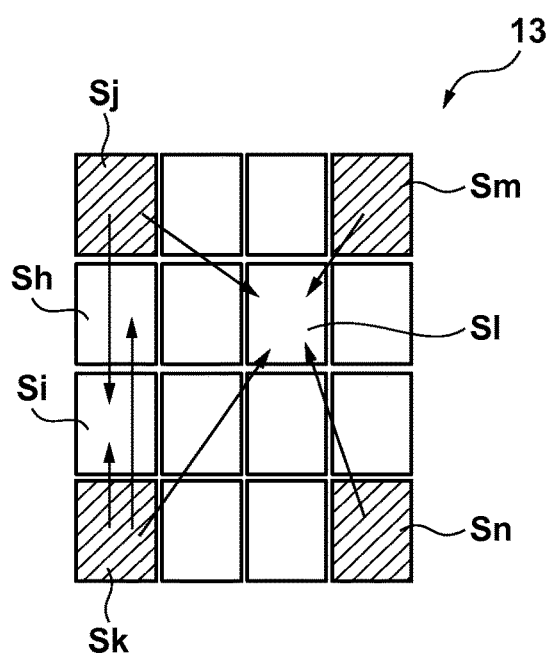

FIG. 9B is a view showing an example of the layout of the shot region 13a of the substrate 13.

Referring to FIG. 9B, the shot regions indicated by the oblique lines represent shot regions whose shapes are measured, and the shot regions in white represent shot regions whose shapes are not measured. In FIG. 9B as well, the shapes of the respective shot regions 13a of the substrate 13 are considered to continuously change, and the shapes of the shot regions whose shapes are not measured are obtained from the measured shapes of the shot regions. For example, the shape of a shot region Sh is the average of the shapes of a shot region Sj and a shot region Sk, but is more similar to the shape of the shot region Sj. More specifically, the influence of the shot region Sk on the shot region Sh is ½ that of the shot region Sj on the shot region Sh in consideration of the distances among the shot regions. In this manner, the degree of influence is proportional to the reciprocal of the distance between shot regions. It is therefore possible to obtain the shape of the shot region Sh by weighed averaging, as follows:

$$\text{shape of the shot region } Sh = \frac{\text{shape of the shot region } Sj \times \frac{1}{1} + \text{shape of the shot region } Sk \times \frac{1}{2}}{\frac{1}{1} + \frac{1}{2}}$$

In a similar manner, the shape of the shot region Si can be obtained as follows:

$$\text{shape of shot region } Si = \frac{\text{shape of shot region } Sj \times \frac{1}{2} + \text{shape of shot region } Sk \times \frac{1}{1}}{\frac{1}{2} + \frac{1}{1}}$$

The shape of a shot region S1 can be obtained by weighted averaging of the shapes of four shot regions Sj, Sk, Sm, and Sn. The distances from the shot regions Sj, Sk, Sm, and Sn to the shot region S1 are 1.2, 2, 1, and 1.2, respectively. Therefore, the shape of the shot region S1 can be obtained as follows:

$$\text{shape of shot region } S1 = \frac{\text{shape of shot region } Sj \times \frac{1}{1.2} + \text{shape of shot region } Sk \times \frac{1}{2} + \text{shape of shot region } Sm \times \frac{1}{1} + \text{shape of shot region } Sn \times \frac{1}{1.2}}{\frac{1}{1.2} + \frac{1}{2} + \frac{1}{1} + \frac{1}{1.2}}$$

How much shot regions whose shapes are measured should be considered for shot regions whose shapes are not measured may be determined in accordance with an actual substrate.

In this embodiment, die-by-die alignment measurement is assumed as the measurement of the displacement between the pattern surface 11a of the mold 11 and the shot region 13a by the measurement unit 15 (step S63). However, this is not exhaustive. The same effects can also be obtained by so-called global alignment measurement, that is, performing statistical operation processing by measuring representative shot regions of the shot regions 13a of the substrate 13, and performing alignment between the mold 11 and the substrate 13 based on the processing result.

As described above, this embodiment controls the imprint process so as to start the first process before the mold 11 is made to face the shot region 13a of the substrate 13 and to start the second process after the mold 11 is made to face the shot region 13a. This makes it possible to take time to correct the shape of the mold 11 and sufficiently correct the shape of the mold 11 while suppressing a deterioration in productivity, thereby achieving high overlay accuracy.

In addition, the imprint process may be controlled to concurrently perform parts of the first process and the second process or to start the first process while relatively moving the mold 11 and the substrate 13 to make the mold 11 face the shot region 13a of the substrate 13. This makes it possible to take more time for the correction of the shape of the mold 11.

In addition, in the second process, it is preferable to correct the displacement between the pattern surface 11a of the mold 11 and the shot region 13a of the substrate 13 in consideration of also the displacement between the pattern on the mold 11 and the shot region 13a of the substrate 13 which is caused by the first process. This makes it possible to shorten the time required for alignment between the mold 11 and the substrate 13 even if parts of the first process and the second process are performed concurrently.

In addition, it is preferable to obtain shot shape information, that is, the shape of the shot region 13a of the substrate 13, for each substrate loaded into the imprint apparatus 1. This makes it possible to sufficiently correct the shape of the mold 11 even with variations in shape among the respective shot regions within a substrate.

Furthermore, in this embodiment, the measurement device 700 outside the imprint apparatus 1 measures the shape of each of the plurality of shot regions 13a of the substrate 13 in advance. Note however that the measurement unit 15 of the imprint apparatus 1 may measure the shape of each of the plurality of shot regions 13a of the substrate 13 in advance before the start of the imprint process.

<Second Embodiment>

Figure 10:
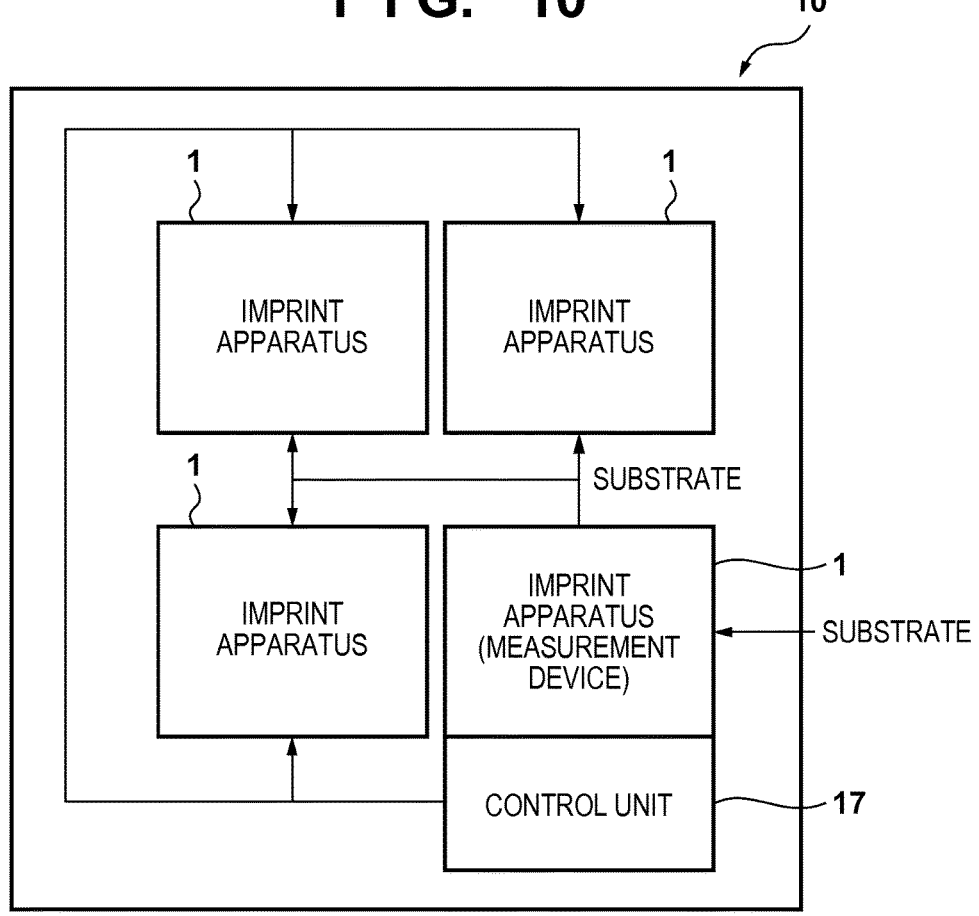
FIG. 10 is a schematic view showing the arrangement of an imprint system according to one aspect of the present invention.

FIG. 10 is a schematic view showing the arrangement of an imprint system 10 according to one aspect of the present invention. The imprint system 10 includes a plurality of imprint apparatuses 1 each configured to perform the imprint process of forming a pattern on a resin on a substrate by using a mold 11. Note that FIG. 10 shows one of control units 17 of the plurality of imprint apparatuses 1 as a main control unit which controls each corresponding one of the plurality of imprint apparatuses 1. Note however that this system may be provided with a main control unit which controls each of the plurality of imprint apparatuses 1 in addition to the control units 17 of the respective imprint apparatuses 1.

It is pointed out that an imprint apparatus is lower in productivity than an exposure apparatus because it takes time to perform a filling step, as described above. Under these circumstances, there is proposed a technique of forming a cluster of a plurality of imprint apparatuses and simultaneously performing the imprint process with respect to a plurality of substrates. According to this technique, since the imprint apparatuses can share some units, it is possible to reduce the total area occupied by the apparatuses and improve productivity per unit area.

For example, as shown in FIG. 10, the imprint system 10 includes four imprint apparatuses 1. At least one of the fourth imprint apparatuses 1, the lower right imprint apparatus 1 in this embodiment, has a function of measuring the shape of each of a plurality of shot regions 13a of a substrate 13. Such a function may be implemented by a measurement unit 15 or by having the measurement device 700 shown in FIGS. 8A and 8B.

According to the related art, the substrates 13 loaded into the imprint system 10 are directly loaded into the respective imprint apparatuses 1, and the imprint process is performed. In contrast to this, according to this embodiment, the substrate 13 is loaded first into the imprint apparatus 1 having a function of measuring the shape of each of a plurality of shot regions 13a of the substrate 13. The imprint apparatus 1 measures the shape of each of the plurality of shot regions 13a of the substrate 13, and sends the measurement results as shot shape information to the control unit 17. The substrates 13 with the shape of each shot region 13a being measured are sequentially loaded into the remaining imprint apparatuses 1. The remaining imprint apparatuses 1 into which the substrates 13 are loaded perform the imprint process according to the sequence shown in FIG. 6.

In this embodiment, only one imprint apparatus 1 has the function of measuring the shape of each of the plurality of shot regions 13a of the substrate 13. However, this is not exhaustive. For example, each of the four imprint apparatuses 1 may have the function of measuring the shape of each of the plurality of shot regions 13a of the substrate 13, and the number of imprint apparatuses 1 used for the measurement of the shape of each shot region 13a may be increased/decreased (changed) in accordance with a recipe or the state of the imprint process.

More specifically, when measuring the shape of the shot regions of only the first substrate in a lot, there is not much necessity to use such functions of measuring the shapes of shot regions. As shown in FIG. 10, therefore, only one imprint apparatus 1 may have the function of measuring the shapes of shot regions. In addition, the above imprint apparatus 1 may directly perform the imprint process after measuring the first substrate in a lot. In contrast, when the shot regions of all the substrates are to be measured, imprint apparatuses to be used to measure the shapes of shot regions may be determined in accordance with the productivity of each imprint apparatus or the throughput of the function of measuring the shapes of shot regions.

The shape (unique amount) of the shot region 13a of the substrate 13 has been described so far. If, however, for example, the distortion caused when the substrate stage holds the substrate 13 is large, some consideration must be given to such distortion. In this embodiment, since the substrate 13 is transferred inside the imprint system 10, it is possible to measure the shape of the shot region 13a while the substrate stage holds the substrate 13 and transfer (so-called chuck transfer) each substrate to a corresponding one of the imprint apparatuses 1 in this state. It is therefore possible to measure the shape of the shot region 13a, including the distortion caused when the substrate stage holds the substrate 13. This makes it possible to more accurately correct the shape of the mold 11.

<Third Embodiment>

Conventionally, a measurement unit 15 of an imprint apparatus 1 performs the condition setting operation of detecting mold-side marks 18 and substrate-side marks 19 while changing measurement conditions and determining optimal measurement conditions based on the detection results. In this case, since it is sometimes impossible to detect the substrate-side marks 19 because of foreign substances and transfer failure or processing failure in a process before the imprint process, a search is made for marks which can be detected (that is, measurement targets). As described above, measurement conditions include, for example, at least one of the light amount/wavelength of light illuminating the mold-side marks 18 and the substrate-side marks 19 and the substrate-side mark 19 as a measurement target.

Note however that if the measurement unit 15 takes much time for measurement, the productivity of the imprint apparatus 1 greatly deteriorates. In this embodiment, therefore, when measuring the shape of each of a plurality of shot regions 13a of a substrate 13 in advance, optimal measurement conditions are introduced to further shorten the time taken for measurement by the measurement unit 15.

A measurement device 700 shown in FIG. 8A uses a measurement method similar to that used by the measurement unit 15 of the imprint apparatus 1 (that is, has a similar arrangement). Therefore, the measurement device 700 shown in FIG. 8A can determine measurement conditions set for the measurement unit 15 in the second process based on the mark information obtained by detecting the substrate-side mark 19 when measuring the shape of each of the plurality of shot regions 13a of the substrate 13. In this case, mark information includes, for example, at least one of contrast, information indicating the deformation of the mark, and information indicating an abnormality in the mark.

In contrast, the measurement device 700 shown in FIG. 8B uses a measurement method different from that used by the measurement unit 15 of the imprint apparatus 1. In such a case, it may be sufficient to obtain in advance the relationship between the measurement conditions set for the measurement device 700 shown in FIG. 8B and the measurement conditions set for the measurement unit 15, that is, the relationship for conversion from the measurement conditions set for the measurement device 700 shown in FIG. 8B to the measurement conditions set for the measurement unit 15. Measurement conditions for the measurement unit 15 may be determined in the second process based on such a relationship and the mark information obtained by detecting the substrate-side mark 19 when measuring the shape of each shot region 13a of the substrate 13.

Figure 11:
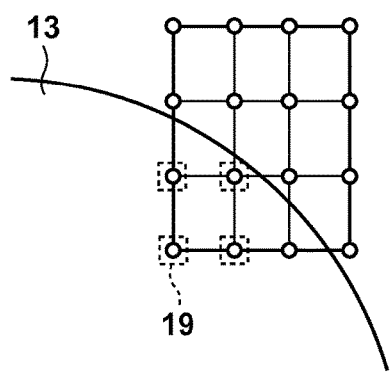
FIG. 11 is a view showing an example of a chipped shot region near the edge of a substrate.

In addition, as described above, it can be determined in advance whether each substrate-side mark 19 can be detected by the measurement unit 15. For example, in order to improve yield, the imprint apparatus 1 needs to perform the imprint process with respect to even a chipped shot region near an edge of the substrate 13 so as to obtain several chips from even the chipped shot region. FIG. 11 is a view showing an example of a chipped shot region near an edge of the substrate 13. Referring to FIG. 11, nine chip regions are arranged in one shot region of the substrate 13, and the substrate-side marks 19 are provided on the four corners of each chip region. When obtaining a rotation as the deviation between the mold 11 and the substrate 13, it is necessary to detect a plurality of substrate-side marks 19 separate from each other, and hence the substrate-side marks 19 on the periphery may be detected. Note however that, as shown in FIG. 11, if it is not possible to detect the substrate-side marks 19 on the periphery, other substrate-side marks 19 near the periphery may be selected based on the mark information obtained by detecting the substrate-side marks 19 when measuring the shape of each shot region 13a of the substrate 13. Selecting in advance the substrate-side marks 19 which can be detected by the measurement unit 15 in this manner can suppress a deterioration in the productivity of the imprint apparatus 1.

In addition, the measurement device 700 shown in FIG. 8B can detect, with high sensitivity, a measurement error caused by irregularity or distortion of the substrate-side mark 19 which occurs during a process, a so-called WIS (Wafer Induced Shift). It is also possible to obtain in advance the relationship between the asymmetry property of the mark signals obtained by detecting the substrate-side marks 19 and a measurement error (error amount) and add an offset to a measurement result based on the obtained relationship. If the WIS is considerably large, the substrate-side marks 19 as measurement targets may be selected (changed) to detect other substrate-side marks 19. In addition, since the WIS continuously changes within a plane of the substrate 13, it is possible to predict the shape of each shot region by weighed averaging of the measured shapes of shot regions, as described in the first embodiment.

<Fourth Embodiment>

A method of manufacturing a device (a semiconductor device, magnetic storage medium, liquid crystal display device, or the like) as an article will be described. This manufacturing method includes a process of forming a pattern on a substrate (a wafer, glass plate, film-like substrate, or the like) by using an imprint apparatus 1 or an imprint system 7 or 10. The manufacturing method further includes a process of processing the substrate on which the pattern is formed. The steps in this process can include a step of removing a residual film of the pattern. In addition, the steps can include other known steps such as a step of etching a substrate by using the pattern as a mask. The method of manufacturing an article according to the embodiment is more advantageous than the related art in terms of at least one of the performance and quality of an article, productivity, and a production cost.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-187031 filed on Sep. 12, 2014, and Japanese Patent Application No. 2015-160957 filed on Aug. 18, 2015, which are hereby incorporated by reference herein in their entirety.

What is claimed is:

1. An imprint apparatus that forms a pattern on an imprint material on a substrate using a mold, the apparatus comprising:
a scope that measures a displacement between a pattern of the mold and a shot region on the substrate;
a memory;
a processor that:
obtains a shape of each shot region of a plurality of shot regions on the substrate before the pattern of the mold and the shot region, as an imprint target on the substrate, face each other;
and
controls an imprint process including a first process and a second process;
a first correction unit, including (1) a heat supply unit, (2) a chuck and an actuator, or both (1) and (2), that corrects, for each shot region on the substrate, a shape difference between the pattern of the mold and the shot region on the substrate by deforming the mold based on the obtained shape for the shot region; and
a second correction unit, including a mold holder, a substrate holder, or both the mold holder and the substrate holder, that corrects, for each shot region on the substrate, the displacement between the pattern of the mold and the shot region on the substrate by moving at least one of the mold or the substrate while the displacement is measured by the scope,
wherein the processor controls the first correction unit to perform the first process of correcting the shape difference between the pattern of the mold and the shot region before the pattern of the mold and the shot region, as the imprint target on the substrate, face each other, and controls the second correction unit to perform the second process of correcting the displacement between the pattern of the mold and the shot region on the substrate after the pattern of the mold and the shot region, as the imprint target, have faced each other.

2. The apparatus according to claim 1, wherein the processor controls the imprint process so that parts of the first process and the second process are concurrently performed.

3. The apparatus according to claim 1, wherein the processor controls the imprint process so that the first process starts while the mold and the substrate are relatively moved to make the pattern of the mold and the shot region on the substrate face each other.

4. The apparatus according to claim 1, wherein, in the second process, the displacement is corrected based on the displacement measured by the scope and the displacement between the pattern of the mold and the shot region on the substrate generated in the first process.

5. The apparatus according to claim 1, wherein the processor obtains the shape of each substrate loaded into the imprint apparatus.

6. The apparatus according to claim 1, wherein the processor obtains a shape measured by an external measurement device of the imprint apparatus.

7. The apparatus according to claim 1, wherein the scope measures each shape of the plurality of shot regions on the substrate, and the processor obtains the shape measured by the scope.

8. The apparatus according to claim 1, wherein the processor obtains measured shapes of all shot regions on the substrate.

9. The apparatus according to claim 1, wherein the processor obtains measured shapes of some shot regions out of all shot regions on the substrate, and obtains shapes of remaining shot regions out of all the shot regions on the substrate based on the shapes of the some shot regions.

10. The apparatus according to claim 9, wherein the processor obtains the shapes of the remaining shot regions by least-square approximation of the shapes of the some shot regions.

11. The apparatus according to claim 9, wherein the processor obtains the shapes of the remaining shot regions by weighted averaging of the shapes of the some shot regions.

12. The apparatus according to claim 6, wherein the measurement device measure measures the shape by detecting a mark provided on the substrate, and
the processor determines a measurement condition of the scope in the second process based on mark information obtained by detecting the mark.

13. The apparatus according to claim 7, wherein the scope measures the shape by detecting a mark provided on the substrate, and
the processor determines a measurement condition of the scope in the second process based on mark information obtained by detecting the mark.

14. The apparatus according to claim 12, wherein the mark information includes at least one of a contrast of the mark, information indicating deformation of the mark, and information indicating an abnormality of the mark.

15. The apparatus according to claim 12, wherein the measurement condition includes at least one of light amounts and wavelengths of light illuminating a mark provided on the mold and a mark provided on the substrate, and a mark provided on the substrate as a measurement target.

16. The apparatus according to claim 1, wherein the shape difference includes at least one of a magnification deviation, a trapezoidal deviation, and a twist between the pattern of the mold and the shot region on the substrate.

17. An imprint system including a plurality of imprint apparatuses, each imprint apparatus of the plurality of imprint apparatuses forming a pattern on an imprint material on a substrate using a mold, and a measurement device that measures a shape of each shot region of a plurality of shot regions on the substrate,
each imprint apparatus of the plurality of imprint apparatuses comprising:
a scope that measures a displacement between a pattern of the mold and a shot region of the plurality of shot regions on the substrate; and
a first correction unit, including (1) a heat supply unit, (2) a chuck and an actuator, or both (1) and (2), that corrects, for the shot region, a shape difference between the pattern of the mold and the shot region by deforming the mold based on the measured shape for the shot region; and a second correction unit, including a mold holder, a substrate holder, or both the mold holder and the substrate holder, that corrects, for the shot region, the displacement between the pattern of the mold and the shot region by moving at least one of the mold or the substrate while the displacement is measured by the scope; and the imprint system comprising:

a memory; and a processor that controls an imprint process of the measurement device and the respective imprint apparatus, wherein the imprint process includes a first process of controlling the first correction unit to correct the shape difference based on the shape measured in advance by the measurement device, and a second process of controlling the second correction unit to correct the displacement while the displacement is measured by the scope, and wherein the processor controls the imprint process so that the first process starts before the pattern of the mold and an imprint target shot region on the substrate face each other, and the second process starts after the pattern of the mold and the imprint target shot region have faced each other.

* * * * *